US009324694B2

(12) United States Patent
Cheng et al.

(10) Patent No.: US 9,324,694 B2
(45) Date of Patent: Apr. 26, 2016

(54) LIGHT-EMITTING DIODE

(71) Applicant: Formosa Epitaxy Incorporation, Taoyuan County (TW)

(72) Inventors: Wei-Kang Cheng, Taoyuan County (TW); Jia-Lin Li, Tainan (TW); Shyi-Ming Pan, Taoyuan County (TW); Kuo-Chin Huang, Chiayi County (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 14/556,251

(22) Filed: Dec. 1, 2014

(65) Prior Publication Data

US 2015/0097202 A1 Apr. 9, 2015

Related U.S. Application Data

(62) Division of application No. 12/552,368, filed on Sep. 2, 2009, now Pat. No. 8,927,303.

(30) Foreign Application Priority Data

Oct. 1, 2008 (TW) .............................. 97137793 A

(51) Int. Cl.

| | |
|---|---|
| ***H01L 25/075*** | (2006.01) |
| ***H01L 33/50*** | (2010.01) |
| ***H01L 33/48*** | (2010.01) |
| ***H01L 33/56*** | (2010.01) |
| ***H01L 33/62*** | (2010.01) |

(52) U.S. Cl.

CPC .......... *H01L 25/0753* (2013.01); *H01L 33/486* (2013.01); *H01L 33/504* (2013.01); *H01L 33/507* (2013.01); *H01L 33/508* (2013.01); *H01L 33/56* (2013.01); *H01L 33/62* (2013.01); *H01L 2924/0002* (2013.01)

(58) Field of Classification Search

IPC .............. H01L 33/508,33/486, 33/504, 33/507, H01L 33/56, 33/62, 25/0753

See application file for complete search history.

(56) References Cited

U.S. PATENT DOCUMENTS

2008/0087902 A1* 4/2008 Lee et al. ........................ 257/88
2008/0173884 A1* 7/2008 Chitnis et al. .................. 257/98
2011/0156078 A1* 6/2011 Hsieh ................. H01L 33/0079 257/98

* cited by examiner

*Primary Examiner* — Yasser A Abdelaziez
(74) *Attorney, Agent, or Firm* — Jianq Chyun IP Office

(57) ABSTRACT

A light-emitting diode (LED) is provided. An LED die includes a first semiconductor layer, a light-emitting layer, a second semiconductor layer, a first electrode and a second electrode. At least a part of the first semiconductor is exposed from the light emitting layer and the second semiconductor layer. The first electrode and the second electrode is disposed on top of the exposed first semiconductor layer and the second semiconductor layer respectively. At least two metal pads are disposed on top of the first electrode and the second electrode of the LED die respectively. Each of the metal pads has a side surface. A fluorescent layer is disposed on a surface of the LED die. The fluorescent layer directly contacts with the side surfaces of the metal pads and fills a gap between the metal pads.

22 Claims, 8 Drawing Sheets

LIGHT-EMITTING DIODE

CROSS-REFERENCE TO RELATED APPLICATION

This application is a divisional application of and claims the priority benefit of a prior application Ser. No. 12/552,368, filed on Sep. 2, 2009, now allowed. The prior application Ser. No. 12/552,368 claims the priority benefit of Taiwan application serial no. 097137793, filed on Oct. 1, 2008. The entirety of each of the above-mentioned patent applications is hereby incorporated by reference herein and made a part of this specification.

FIELD OF THE INVENTION

The invention relates to a light-emitting diode (LED).

BACKGROUND OF THE INVENTION

A light-emitting diode (LED) is a light-emitting device manufactured by semiconductor materials with two electrodes. The light-emitting principle of the LED is that by applying a voltage between the electrodes and supplying an extremely small current, excess energy can be released in the form of light via the recombination process of electrons and holes. The LED is different from an incandescent bulb in that the former is luminescent with advantages of low power consumption, elongated lifetime, no warm-up time, and fast response. In addition, because the LED is small, vibration tolerable, and suitable for mass production, it is easy to be manufactured in an extremely tiny or a matrix form in accordance with application requirements. Currently, the LED is widely applied to indicator and display apparatuses of information, communication, and consumer electronic products, and has become a dispensable and important device in daily lives.

Presently, most LEDs are coated with fluorescent powders in the packages during the packaging process. Thereby, the stress problem will occur in the packages. The invention provides an LED in a single light-mixing chip, which can be packaged directly, and hence reducing effectively the stress problem as described above.

SUMMARY

An embodiment of the invention is to provide a light-emitting diode (LED), in which metal pads can be exposed for the convenience of subsequent wiring and packaging processes.

An embodiment of the invention is to provide a light-emitting diode (LED), in which a single light-mixing chip can be provided for direct packaging and reducing the stress problem in the packaged LED.

An embodiment of the invention provides a light-emitting diode (LED) including an LED die, at least two metal pads, and a fluorescent layer. The LED die includes a first semiconductor layer, a light-emitting layer, a second semiconductor layer, a first electrode and a second electrode. The light-emitting layer is disposed on the first semiconductor layer. The second semiconductor layer is disposed on the light-emitting layer. At least a part of the first semiconductor is exposed from the light emitting layer and the second semiconductor layer. The first electrode and the second electrode are disposed on top of the exposed first semiconductor layer and the second semiconductor layer respectively. The at least two metal pads are disposed on top of the first electrode and the second electrode of the LED die respectively, wherein each of the metal pads has a side surface. The fluorescent layer is disposed on a surface of the LED die. The fluorescent layer directly contacts with the side surfaces of the metal pads and fills a gap between the metal pads. The top surface of the fluorescent layer is flat in a cross-section view. The thickness of the fluorescent layer is greater than 30 μm. All side surfaces of the fluorescent layer are respectively aligned with all outer side surfaces of the LED die.

An embodiment of the invention provides a light-emitting diode (LED) including an LED die, at least two metal pads, and a fluorescent layer. The LED die includes a first semiconductor layer, a light-emitting layer, a second semiconductor layer, a first electrode and a second electrode. The light-emitting layer is disposed on the first semiconductor layer. The second semiconductor layer is disposed on the light-emitting layer. At least a part of the first semiconductor is exposed from the light emitting layer and the second semiconductor layer. The first electrode and the second electrode are disposed on top of the exposed first semiconductor layer and the second semiconductor layer respectively. The at least two metal pads are disposed on top of the first electrode and the second electrode of the LED die respectively, wherein each of the metal pads has a side surface. The fluorescent layer is disposed on a surface of the LED die. The fluorescent layer directly contacts with the side surfaces of the metal pads and fills a gap between the metal pads. The top surface of the fluorescent layer is parallel to the top surface of the light-emitting layer in a cross-section view. The thickness of the fluorescent layer is greater than 30 μm. All side surfaces of the fluorescent layer are respectively aligned with all outer side surfaces of the LED die.

DETAILED DESCRIPTION

In order to make the structure and characteristics as well as the effectiveness of the invention to be further understood and recognized, the detailed description of the invention is provided as follows along with preferred embodiments and accompanying figures.

Figure 1:
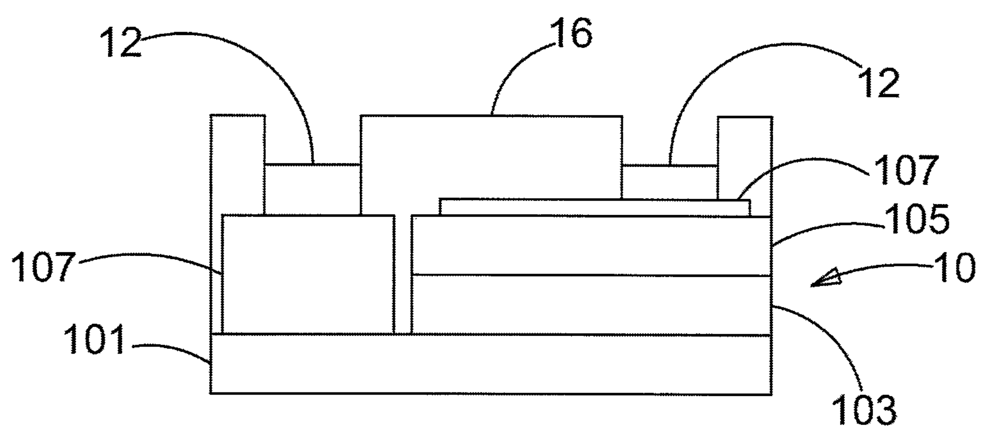
FIG. 1 shows a structural schematic diagram according to a preferred embodiment of the invention.

FIG. 1 shows a structural schematic diagram according to a preferred embodiment of the invention. As shown in the figure, the present embodiment provides a light-emitting diode (LED) 1, which comprises an LED die 10, one or more metal pads 12, and a fluorescent layer 16. The LED die 10 includes two electrodes 107. The number of the metal pads 12 according to the present embodiment is two. The two metal pads 12 are set on the two electrodes 107, respectively. The fluorescent layer 16 is set on the LED die 10. In addition, the fluorescent layer 16 does not cover the two metal pads 12 completely. Instead, the metal pads 12 are exposed for the convenience of subsequent wiring and packaging processes. The fluorescent layer 16 converts partial or all of light with a first wavelength produced by the LED die 10 to light with at least a second wavelength for producing light mixing. The LED 1 provided according to the present embodiment is a light-mixing chip, which can be packaged directly without the need of coating fluorescent powders on the package. The thickness of the fluorescent layer 16 is greater than 30 μm. The materials of the fluorescent layer 16 include fluorescent powders and an organic polymer material. The fluorescent powders are chosen from the group comprising red fluorescent powders, green fluorescent powders, blue fluorescent powders, and the combination of the fluorescent powders described above.

The LED die 10 described above further comprises a first semiconductor layer 101, a light-emitting layer 103, and a second semiconductor layer 105. The light-emitting layer 103 is set on the first semiconductor layer 101; the second semiconductor layer 105 is set on the light-emitting layer 103; the metal pads 12 are set on the electrodes 107. When the first semiconductor layer 101 is P-type, the second semiconductor layer 105 is N-type. Alternatively, when the first semiconductor layer 101 is N-type, the second semiconductor layer 105 is P-type.

Figure 2:
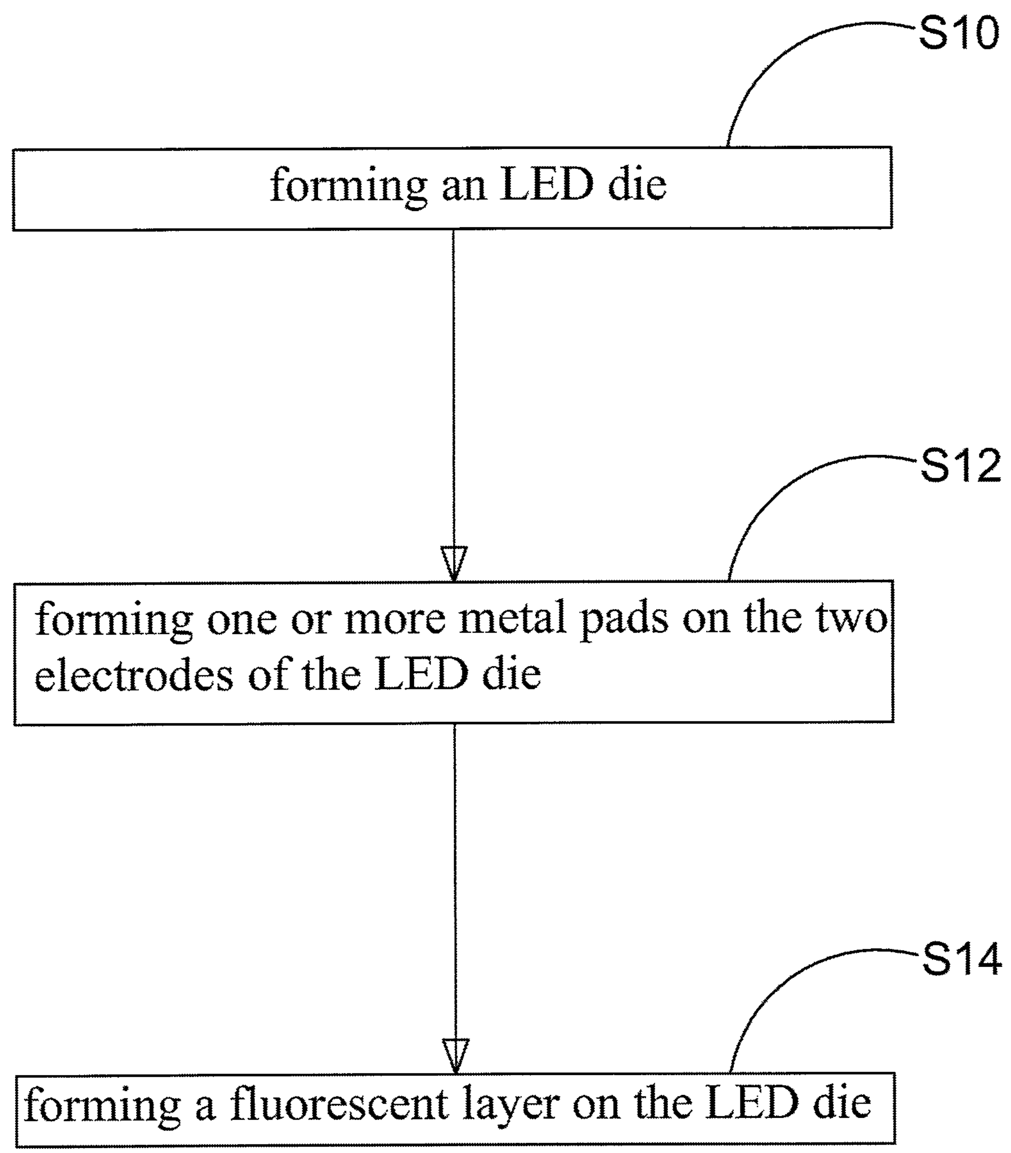
FIG. 2 shows a flowchart according to a preferred embodiment of the invention.
Figure 3:
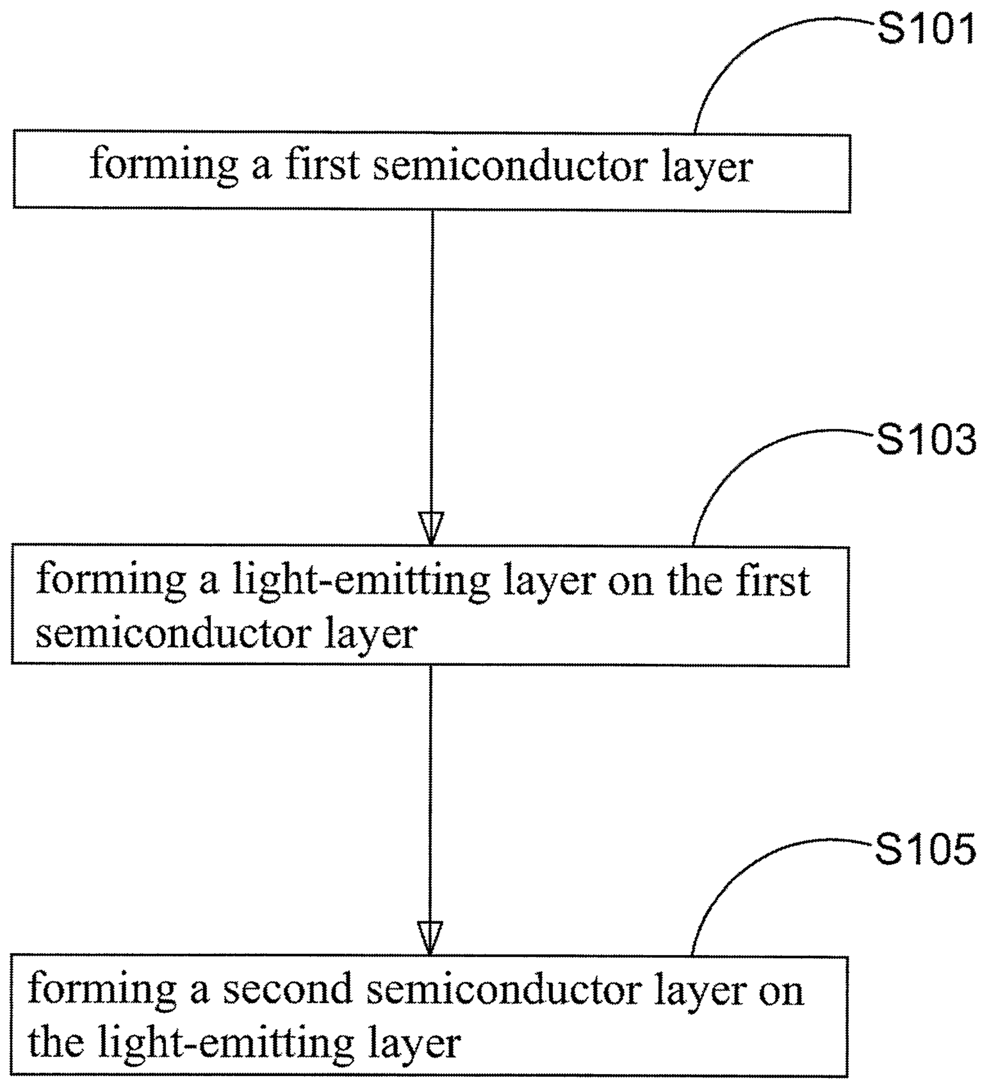
FIG. 3 shows a flowchart for forming an LED die according to a preferred embodiment of the invention.

FIG. 2 shows a flowchart according to a preferred embodiment of the invention. As shown in the figure, in contrast to FIG. 1, which shows an LED 1, the present figure shows a method for manufacturing the LED 1. To manufacture the LED 1, the step S10 is first executed for forming an LED die 10, which includes two electrodes 107. Referring together to FIG. 3, the method for forming the LED die 10 comprises the step S101 forming a first semiconductor layer 101; the step S103 forming a light-emitting layer 103 on the first semiconductor layer 101; and finally the step S105 forming a second semiconductor layer 105 on the light-emitting layer 103.

After the step S10 is completed, the step S12 is executed for forming one or more metal pads 12 on the two electrodes 107 of the LED die 10. Next, the step S14 is executed for forming a fluorescent layer 16 on the LED die 10. The fluorescent layer 16 does not cover the metal pads 12 completely. Instead, the metal pads 12 are left exposed for the convenience of subsequent wiring and packaging processes.

For forming the fluorescent layer 16 on the LED die 10, glue dispensing, spraying, or pouring methods are applied. For avoiding the fluorescent layer 16 from covering the metal pads 12 completely during the forming process of the fluorescent layer 16, prior to forming the fluorescent layer 16 on the LED die 10 using the glue dispensing, spraying, or pouring methods, a mask is used on the metal pads 12. The mask can mask the metal pads 12 and expose the location to form the fluorescent layer 16. Besides, the mask is manufactured by lithography or by screen-printing using organic polymer materials such as photoresist. The LED die is divided a plurality of chips. The glue ratio in the glue dispensing, spraying, or pouring methods is controlled according to the photoelectric properties of each the chip.

Figure 4A:
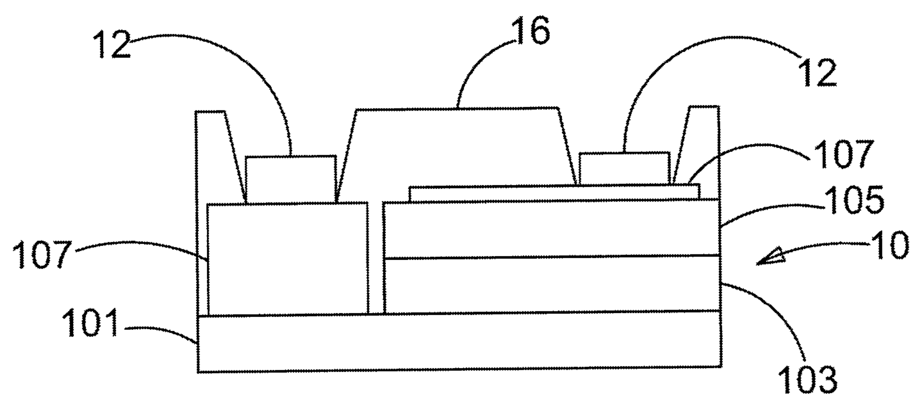
FIG. 4A shows a structural schematic diagram according to another preferred embodiment of the invention.
Figure 4B:
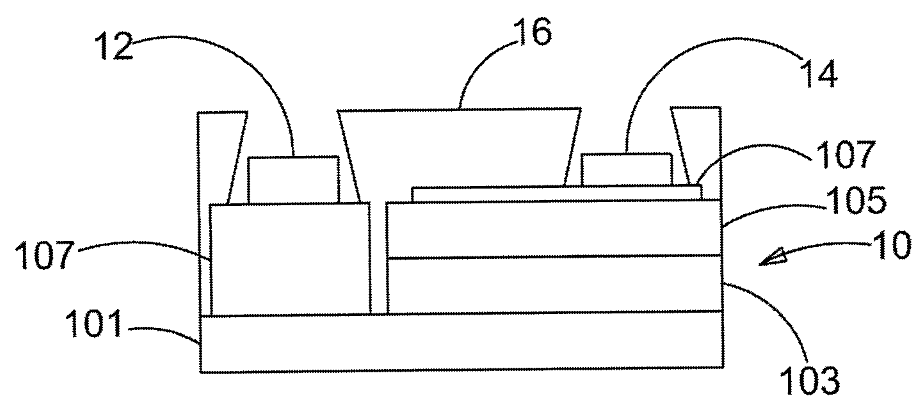
FIG. 4B shows a structural schematic diagram according to another preferred embodiment of the invention.

FIGS. 4A and 4B show structural schematic diagrams according to other preferred embodiments of the invention. As shown in the figures, according to the present embodiments, two LED structures are provided. The difference between the present embodiments and the one described above is that, according to the present embodiments, the shape of the fluorescent layer 16 can be changed by etching. The shapes of the fluorescent layer 16 can be trapezoidal or upside-down trapezoidal.

Figure 5:
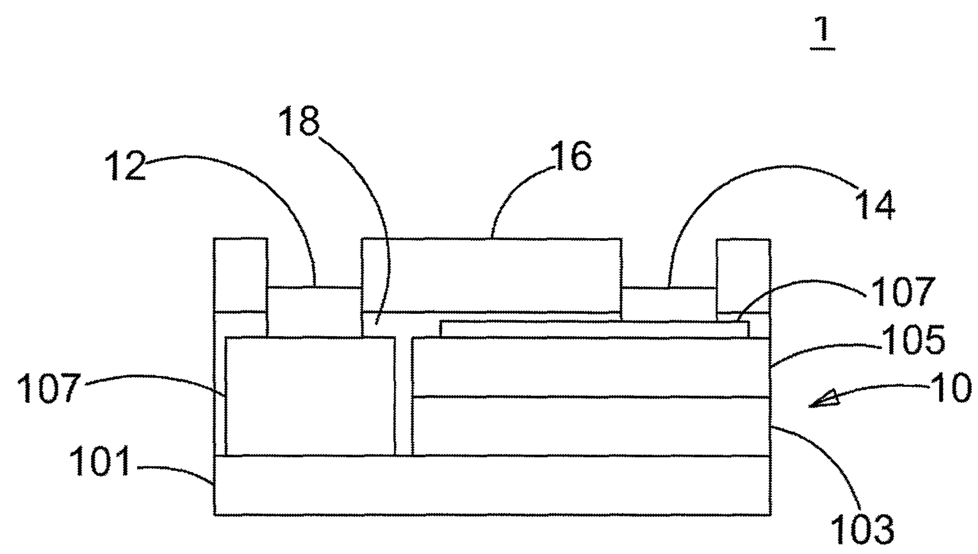
FIG. 5 shows a structural schematic diagram according to another preferred embodiment of the invention.

FIG. 5 shows a structural schematic diagram according to another preferred embodiment of the invention. As shown in the figure, the present embodiment provides an LED 1 comprising an LED die 10, one or more metal pads 12, a dielectric layer 18, and a fluorescent layer 16. The LED die 10 includes two electrodes 107. The metal pads are set on the electrodes 107 of the LED die 10. The dielectric layer 18 is set on the LED die 10, and is located on the periphery of the metal pads 12. The fluorescent layer 16 is set on the dielectric layer 18, and is located on the periphery of the metal pads 12. The fluorescent layer 16 converts partial or all of light with a first wavelength produced by the LED die 10 to light with at least a second wavelength for producing light mixing. In addition, the fluorescent layer 16 does not cover the metal pads 12 completely. Instead, the metal pads 12 are exposed for the convenience of subsequent wiring and packaging processes. The LED 1 provided according to the present embodiment is a light-mixing chip, which can be packaged directly without the need of coating fluorescent powders on the package. Besides, the thickness of the fluorescent layer 16 is greater than 30 μm. The LED die 10 further includes a first semiconductor layer 101, a light-emitting layer 103, and a second semiconductor layer 105.

Figure 6:
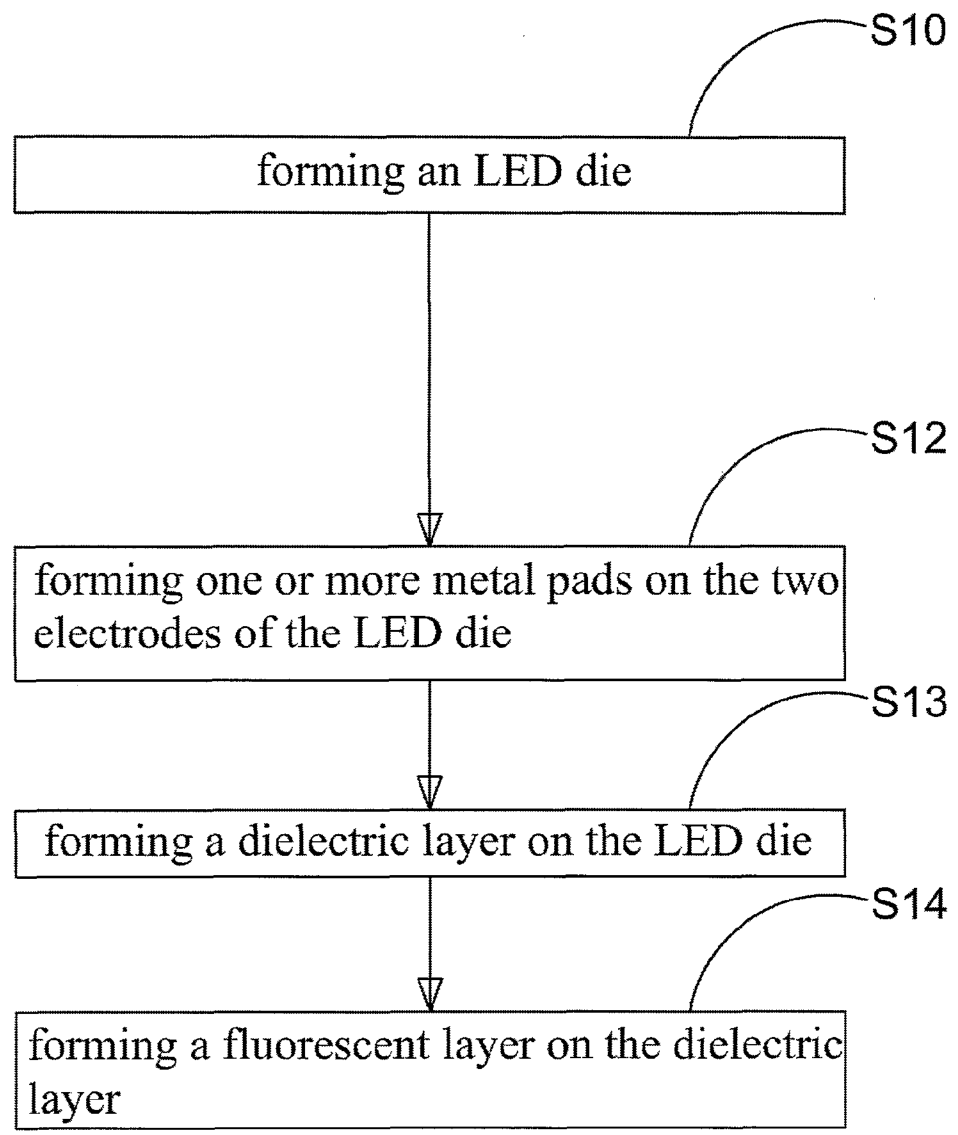
FIG. 6 shows a flowchart according to a preferred embodiment of the invention.

FIG. 6 shows a flowchart according to a preferred embodiment of the invention. As shown in the figure, in contrast to FIG. 5, which shows an LED 1, the present figure shows a method for manufacturing the LED 1. To manufacture the LED 1, the step S10 is first executed for forming an LED die 10. Then the step S12 is executed for forming one or more metal pads 12 on the electrodes 107 of the LED die 10. Next, the step S13 is executed for forming a dielectric layer 18 on the LED die 10. Finally, the step S14 is executed for forming a fluorescent layer 16 on the dielectric layer 18. The fluorescent layer 16 does not cover the metal pads 12 completely. Instead, the metal pads 12 are left exposed for the convenience of subsequent wiring and packaging processes.

For forming the fluorescent layer 16 on the LED die 10, glue dispensing, spraying, or pouring methods are applied. For avoiding the fluorescent layer 16 from covering the metal pads 12 completely during the forming process of the fluorescent layer 16, prior to forming the fluorescent layer 16 on the LED die 10 using the glue dispensing, spraying, or pouring methods, a mask is used on the metal pads 12. The mask can mask the metal pads 12 and expose the location to form the fluorescent layer 16. Besides, the mask is manufactured by lithography or by screen-printing using organic polymer materials such as photoresist.

Figure 7:
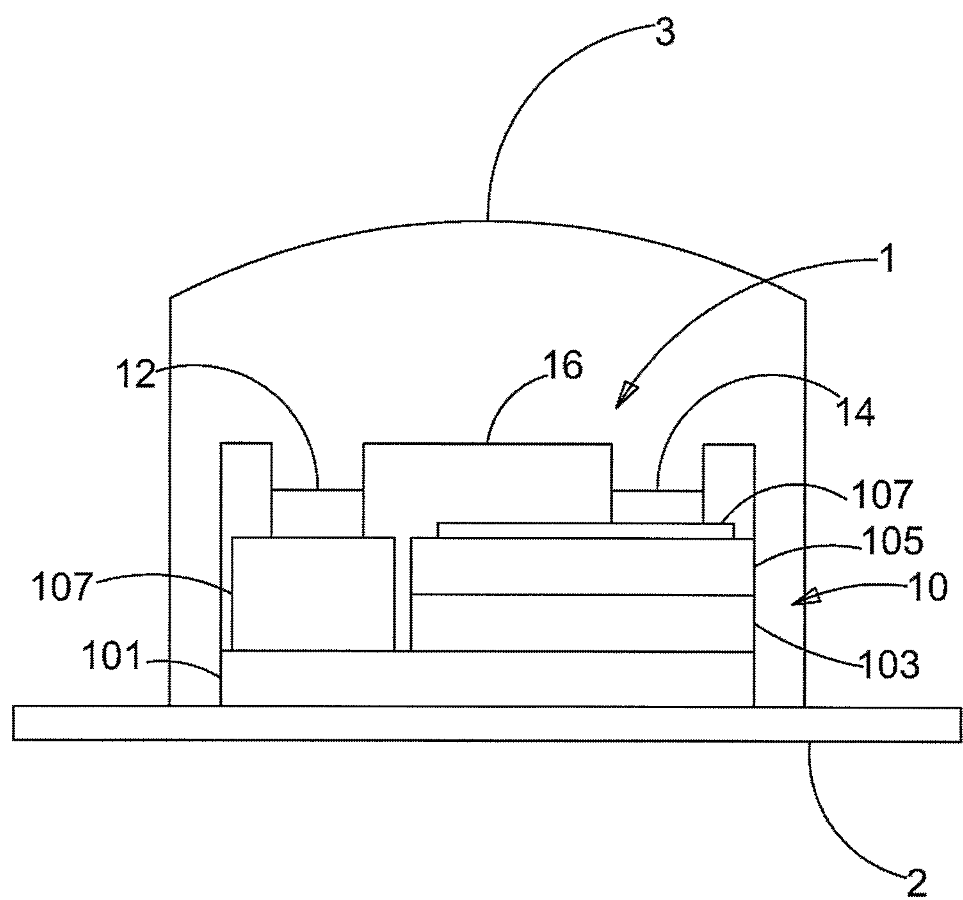
FIG. 7 shows a structural schematic diagram according to another preferred embodiment of the invention.

FIG. 7 shows a structural schematic diagram according to another preferred embodiment of the invention. As shown in the figure, for packaging the LED 1 provided in FIG. 1, the LED 1 is set on a carrier 2. Then, the metal pads 12 are connected by wiring. Finally, use packaging glue 3 to cover the carrier 2 and the LED 1. The material of the packaging glue 3 is organic polymer, and fluorescent powders can be further contained therein. The organic polymer material of the packaging glue 3 differs from the organic polymer material of the fluorescent layer described in FIG. 1. In addition, the packaging glue 3 and fluorescent layer 16 are not processed simultaneously. The baking time of the two is also different, which can reduce the stress problem effectively produced in the package of the LED 1. Moreover, the packaging structure according to present embodiment can be applied to the embodiment of FIG. 5.

Figure 8:
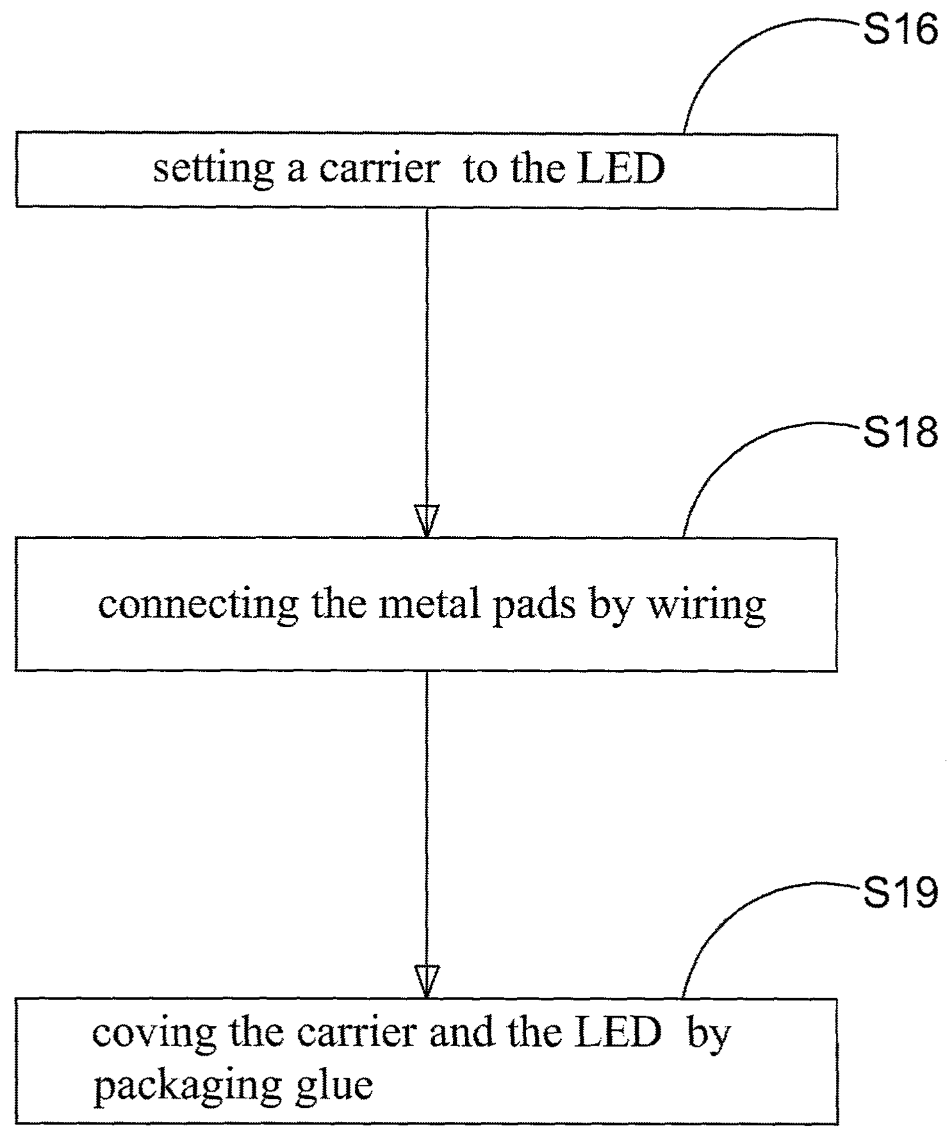
FIG. 8 shows a flowchart according to a preferred embodiment of the invention.

FIG. 8 shows a flowchart according to a preferred embodiment of the invention. As shown in the figure, for packaging the LED 1 provided in FIG. 1, the step S16 is first executed for setting a carrier 2 to the LED 1 and opposite to the fluorescent layer 16. Then the step S18 is executed for connecting the metal pads 12 by wiring. Finally, the step S19 is executed for coving the carrier 2 and the LED 1 by packaging glue 3. The packaging method provided according to the present embodiment can be applied to the LED1 provided in FIG. 5, and will not be described in detail.

It is known from above that the invention provides an LED and a method for manufacturing the same. The characteristics of the invention include that the metals pads are left exposed for the convenience of subsequent wiring and packaging processes. In addition, the LED provided by the invention is a single light-mixing chip, which can be packaged directly without the need of coating fluorescent powders on the packaging glue. Because the fluorescent layer and the packaging glue are not processed simultaneously and are of different materials, the stress problem in the packaged LED can be reduced effectively.

Accordingly, the invention conforms to the legal requirements owing to its novelty, nonobviousness, and utility. However, the foregoing description is only embodiments of the invention, not used to limit the scope and range of the invention. Those equivalent changes or modifications made according to the shape, structure, feature, or spirit described in the claims of the invention are included in the appended claims of the invention.

What is claimed is:

1. A light-emitting diode (LED), comprising:
an LED die comprising:
a first semiconductor layer;
a light-emitting layer disposed on the first semiconductor layer;
a second semiconductor layer disposed on the light-emitting layer, wherein at least a part of the first semiconductor is exposed from the light emitting layer and the second semiconductor layer; and
a first electrode and a second electrode disposed on top of the exposed first semiconductor layer and the second semiconductor layer respectively;
at least two metal pads disposed on top of said first electrode and said second electrode of said LED die respectively, wherein each of the metal pads has a side surface; and
a fluorescent layer disposed on a surface of said LED die, wherein the fluorescent layer directly contacts with the side surfaces of the metal pads and fills a gap between the metal pads, and the top surface of the fluorescent layer is flat in a cross-section view, and the thickness of the fluorescent layer is greater than 30 μm, and all side surfaces of the fluorescent layer are respectively aligned with all outer side surfaces of the first semiconductor layer of the LED die.

2. The LED of claim 1, wherein the materials of the fluorescent layer include fluorescent powders and an organic polymer material, and the materials of said fluorescent powders are chosen from the group comprising red fluorescent powders, green fluorescent powders, blue fluorescent powders, and the combination of the fluorescent powders described above.

3. The LED of claim 1 further comprising:
a carrier is disposed on a side of the LED, and the carrier faces the fluorescent layer.

4. The LED of claim 3 further comprising:
a plurality of wires connected to the metal pads, respectively.

5. The LED of claim 4 further comprising:
a packaging glue disposed on the carrier, wherein the packaging glue covers the LED die, the metal pads and the fluorescent layer.

6. The LED of claim 5, wherein the material of the packaging glue is organic polymer.

7. The LED of claim 6, wherein the material of the packaging glue further comprises fluorescent powders.

8. The LED of claim 1, wherein said LED die has a plurality of chips.

9. The LED of claim 1, wherein the material of said fluorescent layer comprises a material selected from organic materials.

10. The LED of claim 1, wherein a thickness of the fluorescent layer is thicker than a thickness of the second electrode plus a thickness of the metal pad on top of the second electrode.

11. The LED of claim 1, wherein the fluorescent layer fills a gap between the first electrode and the light-emitting layer and a gap between the first electrode and the second semiconductor layer.

12. A light-emitting diode (LED), comprising:
an LED die comprising:
a first semiconductor layer;
a light-emitting layer disposed on the first semiconductor layer;
a second semiconductor layer disposed on the light-emitting layer, wherein at least a part of the first semiconductor is exposed from the light emitting layer and the second semiconductor layer; and
a first electrode and a second electrode disposed on top of the exposed first semiconductor layer and the second semiconductor layer respectively;
at least two metal pads disposed on top of said first electrode and said second electrode of said LED die respectively, wherein each of the metal pads has a side surface; and
a fluorescent layer disposed on a surface of said LED die, wherein the fluorescent layer directly contacts with the side surfaces of the metal pads and fills a gap between the metal pads, and the top surface of the fluorescent layer is parallel to the top surface of the light-emitting layer in a cross-section view, and the thickness of the fluorescent layer is greater than 30 μm, and all side surfaces of the fluorescent layer are respectively aligned with all outer side surfaces of the first semiconductor layer of the LED die.

13. The LED of claim 12, wherein the materials of the fluorescent layer include fluorescent powders and an organic polymer material, and the materials of said fluorescent powders are chosen from the group comprising red fluorescent powders, green fluorescent powders, blue fluorescent powders, and the combination of the fluorescent powders described above.

14. The LED of claim 12 further comprising:
a carrier is disposed on a side of the LED, and the carrier faces the fluorescent layer.

15. The LED of claim 14 further comprising:
a plurality of wires connected to the metal pads, respectively.

16. The LED of claim 15 further comprising:
a packaging glue disposed on the carrier, wherein the packaging glue covers the LED die, the metal pads and the fluorescent layer.

17. The LED of claim 16, wherein the material of the packaging glue is organic polymer.

18. The LED of claim 17, wherein the material of the packaging glue further comprises fluorescent powders.

19. The LED of claim 12, wherein said LED die has a plurality of chips.

20. The LED of claim 12, wherein the material of said fluorescent layer comprises a material selected from organic materials.

21. The LED of claim 12, wherein a thickness of the fluorescent layer is thicker than a thickness of the second electrode plus a thickness of the metal pad on top of the second electrode.

22. The LED of claim 12, wherein the fluorescent layer fills a gap between the first electrode and the light-emitting layer and a gap between the first electrode and the second semiconductor layer.

* * * * *